(12) United States Patent
Naito et al.

(10) Patent No.: US 6,721,153 B2
(45) Date of Patent: Apr. 13, 2004

(54) WIRING CONNECTION STRUCTURE OF LAMINATED CAPACITOR AND DECOUPLING CAPACITOR, AND WIRING BOARD

(75) Inventors: Yasuyuki Naito, Takefu (JP); Masaaki Taniguchi, Fukui-ken (JP); Yoichi Kuroda, Fukui (JP); Haruo Hori, Sabae (JP); Takanori Kondo, Sabae (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 289 days.

(21) Appl. No.: 09/983,187

(22) Filed: Oct. 23, 2001

(65) Prior Publication Data

US 2003/0142460 A1 Jul. 31, 2003

Related U.S. Application Data

(62) Division of application No. 09/584,838, filed on May 31, 2000, now Pat. No. 6,556,420.

(30) Foreign Application Priority Data

Dec. 27, 1999  (JP) ............................................ 11-370802

(51) Int. Cl.[7] ................................................ H02H 3/00
(52) U.S. Cl. .................. 361/100; 361/306.2; 361/306.3
(58) Field of Search .......................... 361/306.1–306.3, 361/307, 308.1, 321.1, 762–766, 508, 100, 321.2, 321.3

(56) References Cited

U.S. PATENT DOCUMENTS

| 5,822,174 A | 10/1998 | Yamate et al. |
| 6,034,864 A | 3/2000 | Naito et al. |
| 6,215,647 B1 | 4/2001 | Naito et al. |
| 6,327,134 B1 | 12/2001 | Kuroda et al. |
| 6,344,961 B1 | 2/2002 | Naito et al. |
| 6,351,369 B1 | 2/2002 | Kuroda et al. |
| 6,370,010 B1 | 4/2002 | Kuroda et al. |
| 6,407,906 B1 * | 6/2002 | Ahiko et al. .............. 361/306.1 |
| 6,407,907 B1 * | 6/2002 | Ahiko et al. .............. 361/306.3 |
| 6,452,781 B1 * | 9/2002 | Ahiko et al. .............. 361/321.2 |
| 6,549,395 B1 * | 4/2003 | Naito et al. .............. 361/306.1 |

FOREIGN PATENT DOCUMENTS

| JP | 60-158612 | 8/1985 |
| JP | 3-36122 | 4/1991 |
| JP | 5-205966 | 8/1993 |
| JP | 7-22728 | 1/1995 |
| JP | 7-142283 | 6/1995 |
| JP | 7-326536 | 12/1995 |
| JP | 11-204372 | 7/1999 |

* cited by examiner

Primary Examiner—Kamand Cuneo
Assistant Examiner—Tuan Dinh
(74) Attorney, Agent, or Firm—Keating & Bennett, LLP

(57) ABSTRACT

An apparatus is provided for packaging a laminated capacitor made to have a low ESL value and is used for a decoupling capacitor to be connected to a power supply circuit for a MPU chip providing a MPU. The laminated capacitor is accommodated within a cavity provided on a wiring board. The capacitor includes a plurality of first external terminal electrodes connected to first internal electrodes via a plurality of first feedthrough conductors and a plurality of second external terminal electrodes connected to second internal electrodes via a plurality of second feedthrough conductors. The first external terminal electrodes provided on a first major surface of a capacitor body are connected to via-hole conductors at the hot side for the power source within a substrate, and the second external terminal electrodes provided on first and second major surfaces are connected to grounding via-hole conductors and a mother board within the substrate.

80 Claims, 5 Drawing Sheets

WIRING CONNECTION STRUCTURE OF LAMINATED CAPACITOR AND DECOUPLING CAPACITOR, AND WIRING BOARD

This Application is a Divisional Application of U.S. patent application Ser. No. 09/584,838, filed on May 31, 2000, now U.S. Pat. No. 6,556,420.

BACKGROUND OF THE INVENTION

1. Field of the Invention

The present invention relates to a wiring connection structure of a laminated capacitor and a decoupling capacitor, and a wiring board. The present invention particularly relates to a laminated capacitor that is advantageously applied to a high frequency circuit, and a wiring connection structure of a decoupling capacitor constructed using the laminated capacitor, and wiring boards.

2. Description of the Related Art

Most typical conventional laminated capacitors include a capacitor body having a plurality of laminated dielectric layers having, for example, ceramic dielectrics, and plural pairs of first and second internal electrodes alternately disposed along the direction of lamination of the dielectric layers in opposed relation with each other so as to define a plurality of capacitor units. First and second external terminal electrodes are provided on the first and second end surfaces, respectively, of the capacitor. The first internal electrodes extend onto the first end surface of the capacitor body, where the first internal electrodes are electrically connected to the first external terminal electrodes. The second internal electrodes are also extended onto the second end surface, where the second internal electrodes are electrically connected to the second external terminal electrodes.

In this laminated capacitor, the electric current flowing, for example, from the second external terminal electrode to the first external terminal electrode flows from the second external terminal electrode to the second internal electrode, and arrives at the first internal electrode from the second internal electrode through the dielectric layer, followed by arriving at the first external electrode through the first internal electrode.

The equivalent circuit of a capacitor is represented by a circuit in which C, L and R are connected in series, where C denotes the capacitance of the capacitor, L denotes an equivalent series inductance (ESL) and R denotes an equivalent series resistance (ESR) mainly defined of the resistance R of the electrode.

The resonance frequency ($f_0$) of this equivalent circuit is represented by an equation of $f_0 = 1/[2\pi \times (L \times C)^{1/2}]$, which means that the function as a capacitor is lost at a higher frequency than the resonance frequency. In other words, the resonance frequency ($f_0$) becomes high when the value of L, or the value of ESL, is small, to allow the capacitor to be available at higher frequencies. Although copper has been used for forming the internal electrode in order to reduce the ESR value, a capacitor designed to have a low ESR value is required for applying the capacitor in microwave regions.

A low ESR value is also required for the capacitor to be used as a decoupling capacitor, which is connected to a power supply circuit for supplying electricity to a MPU chip (a bear chip) of a microprocessing unit (MPU) for a work station or a personal computer.

FIG. 8 is a block diagram illustrating one example of the wiring connection structure of a MPU 1 and a power source 2 as described above.

With reference to FIG. 8, the MPU 1 includes a MPU chip 3 and a memory 4. The power source 2 is provided to supply electricity to the MPU chip 3, and a decoupling capacitor 5 is connected to the power supply circuit including the MPU chip 3 to the power source 2. A signal circuit is provided in the area from the MPU chip 3 to the memory 4.

The decoupling capacitor 5, which is used in conjunction with the MPU 1, is also used for absorbing noises or smoothing fluctuation of the power source in the same way as conventional decoupling capacitors are used. However, use of a decoupling capacitor having operating frequencies of over 500 MHz and up to 1 GHz have been recently contemplated in a MPU chip 3, which is required to have a function as a quick power supply (a function to supply electric power from the charged electricity of a capacitor within a time interval of several nano-seconds, when electricity is urgently needed for power-up of the system), when a high speed operation is required with respect to the MPU chip 3.

The power source is actually designed so that a DC power of about 2.0 V is supplied to the MPU chip 3 (with an operation clock frequency of about 500 MHz) with a power consumption of about 24 W, or an electric current of 12 A. For reducing power consumption, the system is configured to put the system in a sleep mode when the MPU chip 1 is on alert, thereby reducing the power consumption to 1 W or less. Electric power required for converting the system from the sleep mode to the active mode should be supplied to the MPU chip 3 within a time interval of the operating clock frequency, or the electric power should be supplied to the CPU within a time interval of about 4 to about 7 nanoseconds at an operation frequency of 500 MHz for converting the system from the sleep mode to the active mode.

However, because the supply of the electric power from the power source 2 is too late, the MPU chip 3 has been powered by discharging the electricity accumulated in the decoupling capacitor 5 placed in the vicinity of the MPU chip 3 before the electricity is supplied from the power source 2.

Accordingly, the inductance component has been desired to be as low as possible in the decoupling capacitor 5 for the MPU 1, urging development of a capacitor having a very low inductance value.

Under the conditions described above, a wiring structure of a laminated capacitor that is able to lower the ESL value has been proposed in Japanese Unexamined Patent Publication No. 11-204372.

The ESL value is mainly reduced by offsetting magnetic fields induced by the electric current flowing in the laminated capacitor. Therefore, the electric current is allowed to flow along various directions in the laminated capacitor in order to offset the magnetic fields. For diversifying the current directions, the number of the external terminal electrodes provided on the surface of the capacitor body is increased, or the number of externally exposed terminal tabs of the internal electrodes to be electrically connected to the external terminal electrodes is increased, besides shortening the flow path length of the current flowing through the internal electrodes.

FIG. 9 illustrates a laminated capacitor 11 disclosed in the foregoing Japanese Unexamined Patent Application Publication No. 11-204372 together with an illustration of the cross-sectional structure of a MPU 12 using the laminated capacitor 11 as a decoupling capacitor.

With reference to FIG. 9, the laminated capacitor 11 is provided with a capacitor body 14 including a plurality of laminated dielectric layers 13. At least one pair of first and second internal electrodes 15 and 16 arranged opposite to each other with specified layers of the dielectric layer 13 disposed therebetween are provided within the capacitor body 14.

Both of first and second external electrodes 18 and 19 are provided on the first major surface 17 of the capacitor body 14 extending substantially parallel to the internal electrodes 15 and 16. External terminal electrodes are not provided at all on a second major surface 20 which is opposite to the first major surface 17.

First feedthrough conductors 21, which perforate through specified layers of the dielectric layers 13 so as to provide electrical continuity between the first internal electrodes 15 and the first external terminal electrodes 18 while the electrodes are electrically insulated from the second internal electrode 16, and second feedthrough conductors 22, which perforate through specified layers of the dielectric layer 13 so as to provide electrical continuity between the second internal electrodes 16 and the second external terminal electrodes 19 while the electrodes are electrically insulated from the first internal electrodes 15, are provided within the capacitor body 14.

A plurality of the first and second feedthrough conductors 21 and 22 are provided, and a plurality of the first and second external terminal electrodes 18 and 19 are also provided corresponding to positions of the respective first and second feedthrough conductors 21 and 22.

According to the laminated capacitor 11 as described above, the magnetic fields induced by the electric current flowing through the internal electrodes 15 and 16 offset each other to lower the ESL value, since the directions of the electric current flowing through the internal electrodes 15 and 16 are diversified in addition to the flow path being shortened.

The MPU 12 includes, on the other hand, a multi-layered wiring board 24 having a cavity 23 on the bottom surface thereof. A MPU chip 25 is mounted on the surface of the wiring board 24. The laminated capacitor 11 that defines a decoupling capacitor is accommodated within the cavity 23 of the wiring board 24. The wiring board 24 is mounted on the surface of a mother board 26.

As illustrated in the drawing, wiring conductors required for the MPU 12 are arranged within and on the surface of the wiring board 24, and an electrical circuit as shown in FIG. 8 is completed by these wiring conductors.

A representative example includes hot-side electrodes 27 for a power source and ground electrodes 28 disposed within the wiring board 24.

The hot-side power electrode 27 is electrically connected to the first external terminal electrode 18 of the laminated capacitor 11 through a via-hole conductor 29 at the hot side for the power source, is electrically connected to a specified terminal 31 of the MPU chip 25 through a via-hole conductor 30 at the hot side of the power source, and is electrically connected to a hot-side conductive land 33, which is destined to be in electrical continuity with the mother board 26, through a via-hole conductor 32 at the hot side for the power source.

The ground electrode 28 is electrically connected to the second external terminal electrode 19 of the laminated capacitor 11 through a via-hole conductor 34 for grounding, is electrically connected to a specified terminal 36 of the MPU chip 25 through a via-hole conductor 35 for grounding, and is electrically connected to a conductive land 38 for grounding, which is destined to be connected to the mother board 26, through a via-hole conductor 37 for grounding.

Illustration of the memory corresponding to the memory 4 shown in FIG. 8 is omitted in FIG. 9.

Both of the first and second external terminal electrodes 18 and 19 are located on the major surface 17 of the capacitor body 14 in the laminated capacitor 11 as shown in FIG. 9. For example, if the wiring conductor has a ground potential, then the second external terminal electrode 19 of the capacitor 11 is connected to the conductive land 38 for grounding after passing through the via-hole 34 for grounding, the via-hole conductor 34 for grounding, the ground electrode 28 and the via-hole conductor 37 for grounding in the wiring board 24.

Accordingly, the length of the ground side line determined by the lengths of the via-holes conductors 34 and 37 for grounding, and the length of the ground electrode 28 turns out to be relatively longer so as to increase the inductance component generated around the ground side line. As a result, the effect of using the laminated capacitor 11 designed to have a low ESL value is compromised and reduced. The relatively longer ground side line also causes an increase of impedance.

Increasing of the length of the ground side line as described above also causes the wiring in the wiring board 24 to be very complicated.

SUMMARY OF THE INVENTION

In order to overcome the problems described above, preferred embodiments of the present invention provide a laminated capacitor that solves the problems described above by providing a wiring connection structure of a decoupling capacitor constructed using the laminated capacitor, and a wiring board.

The laminated capacitor according to preferred embodiments of the present invention preferably includes a capacitor body having a laminated body including a plurality of dielectric layers.

At least a pair of first and second internal electrodes disposed opposed to each other with one of the dielectric layers disposed therebetween are provided within the capacitor body.

A plurality of first feedthrough conductors, which perforate through specified layers of the dielectric layers while being electrically insulated from the second internal electrode and being in electrical continuity with the first internal electrode, and a plurality of second feedthrough conductors, which perforate through the capacitor body while being electrically insulated from the first internal electrode and being in electrical continuity with the second internal electrode, are provided in the capacitor body. These first and second feedthrough conductors are arranged so that magnetic fields induced by the electric current flowing through the internal electrodes offset each other.

The laminated capacitor according to preferred embodiments of the present invention also preferably include a plurality of first external terminal electrodes, which are provided so as to correspond to the respective first feedthrough conductors while being electrically connected to the respective plural first feedthrough conductors, and a plurality of second external terminal electrodes, which are provided so as to correspond to the respective second feedthrough conductors while being electrically connected to the respective plural second feedthrough conductors.

The first external terminal electrodes are located at least on the first major surface of the capacitor body extending substantially parallel to the internal electrodes, and the second external terminal electrodes are located on both the first major surface and the second major surface in opposed relation to the first major surface.

The first external terminal electrodes as well as the second external terminal electrodes may be located on both the first major surface and the second major surface in the laminated capacitor according to preferred embodiments of the present invention.

In brief, the laminated capacitor according to preferred embodiments of the present invention includes a plurality of the first external terminal electrodes, which are arranged to correspond to respective plural first feedthrough conductors connected to the first internal electrodes, and a plurality of second external terminal electrodes which are arranged to correspond to respective plural second feedthrough conductors connected to the second internal electrodes, the first external terminal electrodes being provided on at least the first major surface of the capacitor body, while the second external terminal electrodes being provided on both the first and second major surfaces.

The second feedthrough conductors are electrically connected to the second external terminal electrodes located on both the first and second major surfaces, and the first feedthrough conductors are electrically connected to the first external terminal electrodes when the first external terminal electrodes are located on both the first and second major surfaces. The feedthrough conductors perforating so as to reach both the first and second major surfaces as described above preferably have a cross-sectional area of about $2 \times 10^{-3}$ mm$^2$ or more, and more preferably have a cross-sectional area of about $7 \times 10^{-3}$ mm$^2$ or more, and further preferably have a cross-sectional area of about $1.5 \times 10^{-2}$ mm$^2$ or more.

It is preferable that solder bumps are formed on the first and second external terminal electrodes.

Other preferred embodiments of the present invention are directed toward the wiring connection structure of the decoupling capacitor to be connected to a power supply circuit for the MPU chip provided in the microprocessing unit. In this wiring connection structure, the decoupling capacitor preferably includes a capacitor body having first and second major surfaces opposite to each other, and feedthrough conductors perforating from the first to the second major surfaces within the capacitor body. Power supply lines and/or signal lines to be connected to the MPU chip are grounded to a mother board via the feedthrough conductors.

The laminated capacitor according to preferred embodiments of the present invention can be advantageously used as the decoupling capacitor in the wiring connection structure of the decoupling capacitor as described above. It is preferable in the wiring connection structure that the hot side of the power supply circuit is connected to the first external terminal electrode of the laminated capacitor. With the unique wiring connection structure described above allows the ground side of the power supply circuit to be electrically connected, for example, to the ground side conductive land on the mother board via the second external terminal electrode and second feedthrough conductor. When the first external terminal electrodes are located on both the first major surface and second major surface, the hot side of the power supply circuit is made to be electrically connected, for example, to the hot side conductive land on the mother board.

Preferred embodiments of the present invention are also directed to a wiring board, on which a MPU chip provided in the microprocessing unit is mounted. The wiring board includes a wiring conductor at the hot side of the power source for supplying electricity to the MPU chip and a ground side wiring conductor. The laminated capacitor according to preferred embodiments of the present invention described above is packaged on this wiring board so that the first major surface is directed toward the wiring board side and the second major surface is directed toward the outside of the package. The first external terminal electrode at the first major surface side is electrically connected to the wiring conductor at the hot side of the power source, while the second external terminal electrode at the first major surface side is electrically connected to the ground side wiring conductor in the package.

When laminated capacitors located on both the first major surface and the second major surface are used in the wiring board as described above, the first external terminal electrode at the first major surface side is electrically connected to the wiring board at the hot side of the power source, and the second external terminal electrode at the first major surface side is electrically connected to the ground side wiring conductor in packaging the laminated capacitor, while electricity is supplied from the first external terminal electrode at the second major surface side.

In preferred embodiments of the present invention directed to the wiring board as described above, the MPU chip is preferably mounted on the first substrate of the wiring board, and a cavity having an opening located along the second substrate surface in opposed relation to the first substrate surface is provided on the wiring board. The laminated capacitor is accommodated in the cavity with its second major surface disposed toward the opening of the cavity, in addition to the second major surface being located on the same level as the second substrate surface.

In the wiring board according to preferred embodiments of the present invention, the plural terminals provided at the MPU chip may be arranged to have the same pitch as those of the arrangement of the first and second external terminal electrodes of the laminated capacitor.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Figure 1:
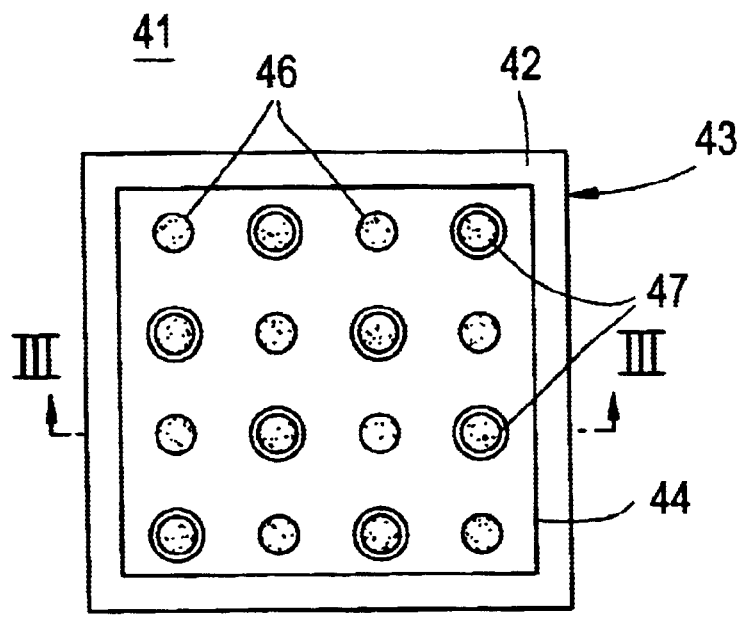
FIG. 1 shows a plan view of the internal structure of the laminated capacitor 41 according to a preferred embodiment of the present invention, indicating a cross-section dissected along the first internal electrode 44.
Figure 2:
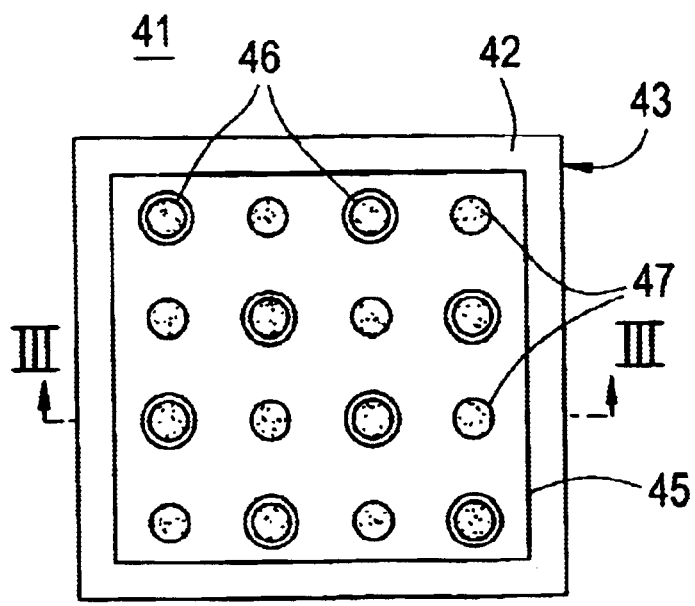
FIG. 2 shows a plan view of the internal structure of the laminated capacitor 41 shown in FIG. 1, indicating a cross-section dissected along the second internal electrode 45.
Figure 3:
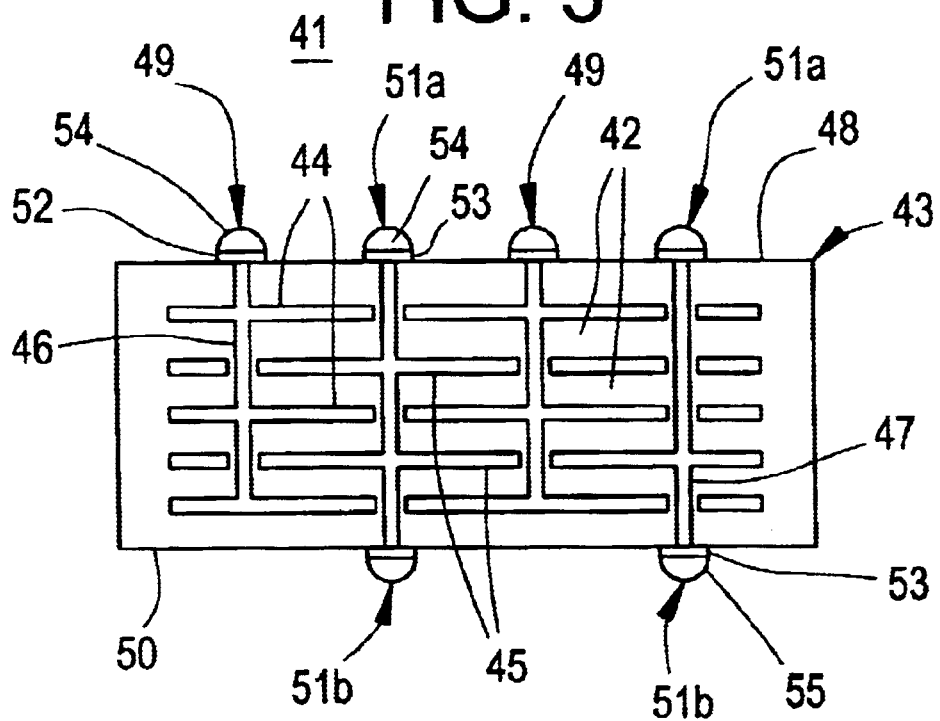
FIG. 3 shows a cross-section of the laminated capacitor 41 along the line III—III shown in FIGS. 1 and 2.

FIGS. 1 to 3 illustrate a laminated capacitor 41 according to a preferred embodiment of the present invention. FIGS. 1 and 2 are plan views of the laminated capacitor 41 showing the internal structure of the laminated capacitor 41 having mutually different cross-sections. FIG. 3 shows a cross-section along the line III—III shown in FIG. 1 or 2.

The laminated capacitor 41 preferably includes a capacitor body 43 containing a laminated body of a plurality of dielectric layers 42. The dielectric layers 42 are preferably made of, for example, ceramic dielectrics or other suitable material.

At least one pair of first and second internal electrodes 44 and 45 opposed to each other with one of the dielectric layers disposed therebetween 42 are provided within the capacitor body 43. Plural pairs of the first and second internal electrodes 44 and 45 are provided in this preferred embodiment.

A plurality of first feedthrough conductors 46 perforating through specified layers of the dielectric layers are provided within the capacitor body 43, while the conductors are electrically insulated from the second internal electrodes 45 and electrically connected to the first internal electrodes 44. A plurality of second feedthrough conductors 47 perforating through the capacitor body 43 are also provided while the conductors are electrically insulated from the first internal electrodes 44 and electrically connected to the second internal electrodes 45.

A plurality of first external terminal electrodes 49 corresponding to respective first feedthrough conductors 46 are provided on a first major surface 48 of the capacitor body 43 so as to extend substantially parallel to the internal electrodes 44 and 45, while the electrodes are electrically connected to respective plural feedthrough conductors 46.

A plurality of second external terminal electrodes 51a corresponding to the respective second feedthrough conductors 47 are provided on the first major surface 48 of the capacitor body 43, while the electrodes are electrically connected to the respective second feedthrough conductors 47. A plurality of second external terminal electrodes 51b corresponding to the respective second feedthrough conductors 47 are also provided on a second major surface 50 in opposed relation to the first major surface 48, while the electrodes are electrically connected to the respective second feedthrough conductors 47.

Plural first and second internal electrodes 44 and 45 are arranged in this preferred embodiment, such that the electrostatic capacitance generated between the internal electrodes 44 and 45 connected in parallel through the first and second feedthrough conductors 46 and 47, and the electrostatic capacitance connected in parallel as described above is extracted between the first external electrode 49, and the second external electrodes 51a and 51b.

The first feedthrough conductors 46 and the second feedthrough conductors 47 are arranged to offset the magnetic fields induced by the electric current flowing through the internal electrodes 44 and 45. In other words, the first and second internal electrodes 46 and 47 are arranged adjacent to each other in order to diversify the direction of the electric current flowing through the internal electrodes 44 and 45 in addition to shortening the length of the current flow path in this preferred embodiment. As a result, the ESL value is greatly decreased.

Conductive pads 52 and 53, and solder bumps 54 and 55 are preferably provided on the first external electrodes 49 and the second external electrodes 51a and 51b in this preferred embodiment.

The conductive pads 52 and 53 are preferably made of, for example, a Cr/Ni/Cu deposition film, while the internal electrodes 44 and 45, and the feedthrough conductors 46 and 47 are preferably made by, for example, baking the conductive paste containing Ni.

Figure 4:
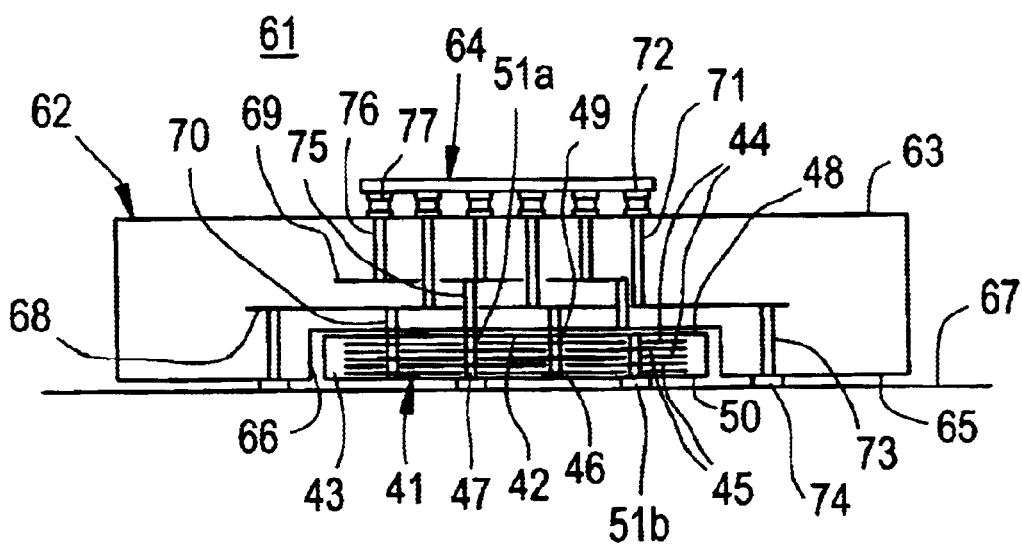
FIG. 4 shows a cross-section illustrating an example of the structure of the MPU 61 in which the laminated capacitor 41 shown in FIGS. 1 to 3 is used for the decoupling capacitor.
Figure 9:
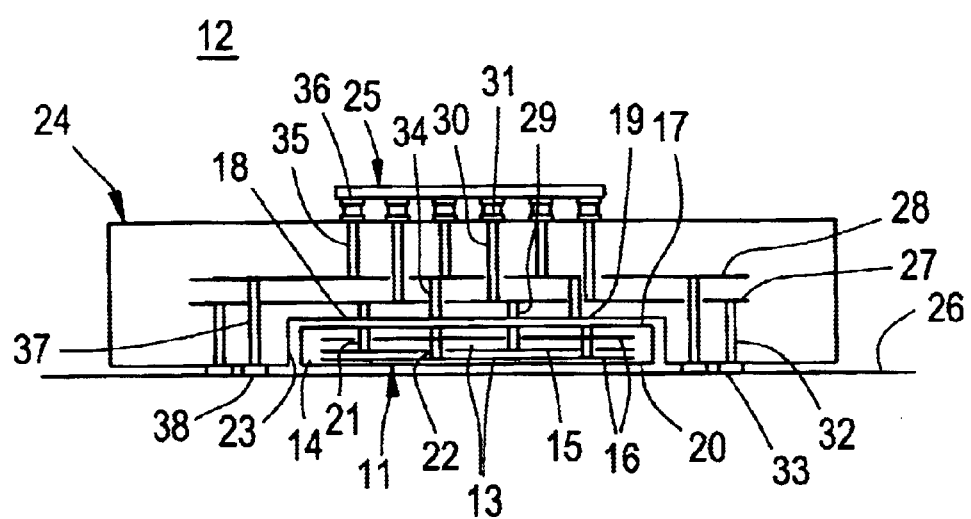
FIG. 9 is a drawing corresponding to FIG. 4, which is a cross-section illustrating one example of the structure of the MPU 12 in which the conventional laminated capacitor 11 is used for the decoupling capacitor.

FIG. 4 is a drawing corresponding to FIG. 9, which illustrates a MPU 61 in which a laminated capacitor 41 as described in the foregoing preferred embodiments is used as a decoupling capacitor.

With reference to FIG. 4, the MPU 61 includes a wiring board 62, and a MPU chip (a bare chip) 64 is mounted on the surface of a first substrate 63 at the upper side of the wiring board 62.

A cavity 66 is provided at the side of a second substrate surface 65 located at a lower surface side of the wiring board 62. The cavity 66 allows the opening to be located along the second substrate surface 65.

The laminated capacitor 41 described above is accommodated within the cavity 66 while a second major surface 50 of the capacitor body 43 is directed toward the opening of the cavity 66. The second major surface 50 of the capacitor body 43 is located on the same level as the second substrate surface 65 of the wiring board 62.

The wiring board 62 as described above is mounted on the surface of a mother board 67.

Wiring conductors required for the MPU 61 are provided on the surface and within the wiring board 62 as illustrated in the drawing, and an electric circuit is completed by these wiring conductors.

In a representative example, a hot-side electrode 68 for the power source and a ground electrode 69 are provided within the wiring board 62.

The hot-side electrode 68 for the power source is electrically connected to the first external terminal electrode 49 of the laminated capacitor 41 through a via-hole conductor 70 at the hot-side for the power source, and electrically connected to a specified terminal 72 of the MPU chip 64 through a via-hole 71 at the hot-side for the power source, besides being electrically connected to a hot-side conductive land 74 to be connected to the mother board 67 through a via-hole conductor at the hot side for the power source.

Although the hot-side wiring connection structure is not illustrated in detail in FIG. 4, a wiring connection structure via the bump is applied for electrical connections between the via-hole conductor 70 at the hot-side for the power source and the first external terminal electrode 49, and between the via-hole conductor 71 at the hot-side for the power source and the terminal 72, and solder bumps are preferably provided on the hot-side conductive land 74.

The ground electrode 69 is electrically connected to the external terminal electrode 51a at the first major surface 48 side of the laminated capacitor 41 through the grounding via-hole conductor 75, and is electrically connected to a specific terminal 77 of the MPU chip 64 through the grounding via-hole conductor 76. In the laminated capacitor 41, the second external terminal electrode 51a at the first major surface 48 side is electrically connected to the second external terminal electrode 51b at the second major surface 50 side via the second feedthrough conductor 47, and the second external terminal electrode 51b is grounded to the ground side conductive land on the mother board 67, thus grounding the ground electrode 69.

Although the wiring connection structures in the ground side are not illustrated in detail in FIG. 4, electrical connection via the bumps achieves electrical connection between the grounding via-hole conductor 75 and the second external terminal electrode 51a, and the electrical connection between the grounding via-hole conductor 76 and the terminal 77. The solder bump 55 (see FIG. 3) is preferably disposed on the second external terminal electrode 51b as described above.

According to the preferred embodiments described above, wiring in the wiring board 62 is greatly simplified because elements corresponding to respective via-hole conductors 37 for grounding and ground side conductive lands 38 are omitted. In addition, the length of ground side lines is relatively shortened, since grounding to the ground electrode 68 is performed via the second feedthrough conductor 47 within the capacitor 41. Consequently, inductance components and impedance components are reduced to enable the system to be operated at a high frequency.

With respect to the laminated capacitor 41 in this preferred embodiment, current flow directions on the cross-section shown in FIG. 3 can be reversed with each other between the first feedthrough conductor 46 and feedthrough conductor 47 in the discharge stage after charging. Therefore, magnetic fields offset each other to consequently and greatly decrease the ESL value.

Figure 8:
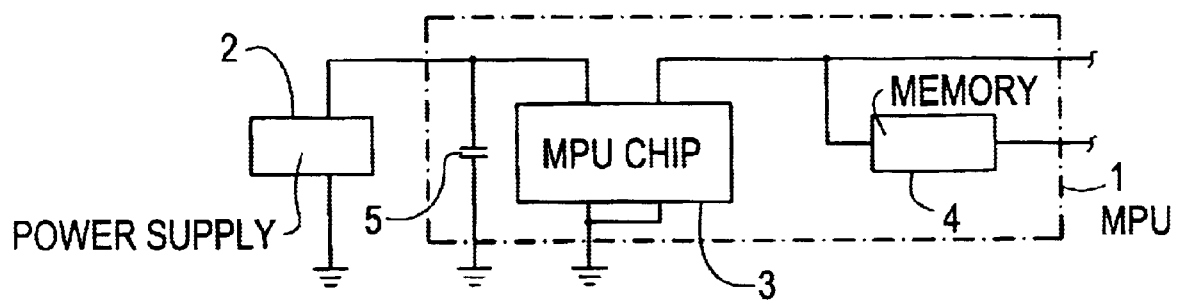
FIG. 8 shows a block diagram illustrating the wiring connection structure with respect to the MPU 1 and power source 2 which are relevant to preferred embodiments of the present invention.

Illustration of a memory corresponding to the memory 4 in FIG. 8 is omitted in FIG. 4.

Figure 5:
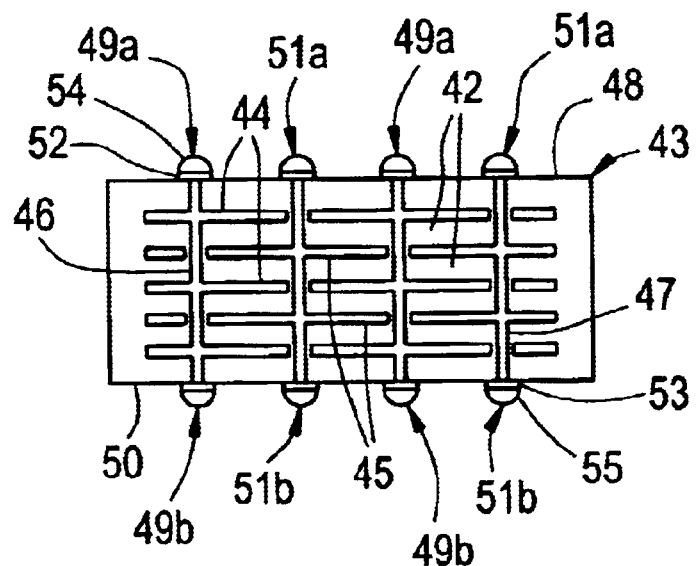
FIG. 5 shows the laminated capacitor according to another preferred embodiment of the present invention corresponding to FIG. 3.

FIG. 5 is a drawing corresponding to FIG. 3, and shows a laminated capacitor 41a according to another preferred embodiment of the present invention. The same reference numerals are given to the elements in FIG. 5 corresponding to those shown in FIG. 3, and repeated explanations thereof are omitted.

The laminated capacitor 41a shown in FIG. 5 includes the second external terminal electrodes 51a and 51b, and the first external terminal electrodes 49a and 49b are located on both the first major surface 48 and the second major surface 50 of the capacitor body 43. In other words, the first external terminal electrodes 49a is located on the first major surface 48, and the first external terminal electrodes 49b is disposed on the second major surface 50.

According to this preferred embodiment, the current flow directions on the cross-section shown in FIG. 5 can be reversed with each other between the first feedthrough conductor 46 and the second feedthrough conductor 47 in both stages of charging and discharging. Consequently, the ESL value is greatly reduced by the offset effect of magnetic fields caused by the current flow directions as described above.

Figure 6:
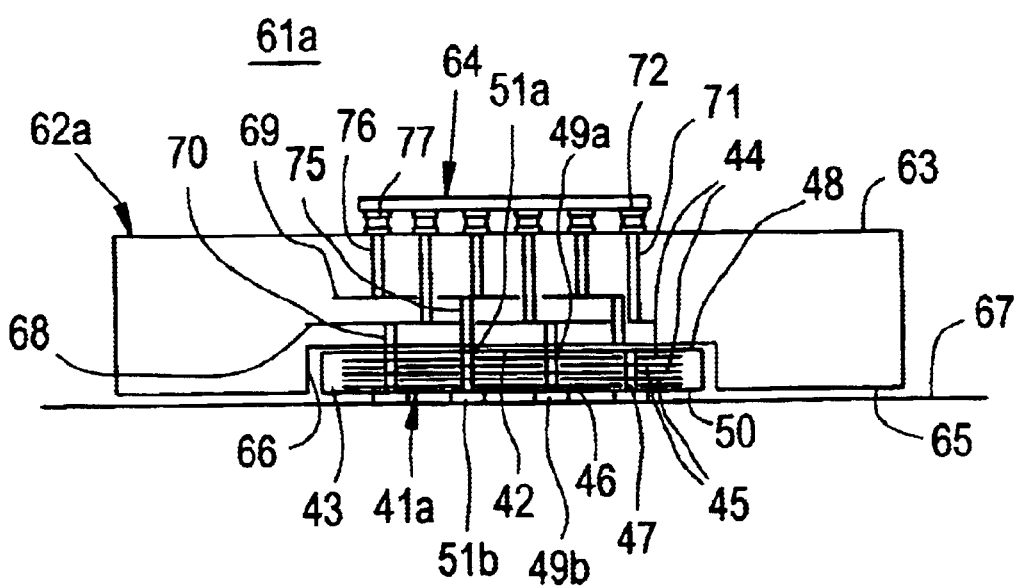
FIG. 6 shows a cross-section illustrating an example of the structure of the MPU 61a in which the laminated capacitor 41a shown in FIG. 5 is used for the decoupling capacitor.

FIG. 6 is a drawing corresponding to FIG. 4, showing a MPU 61a in which the laminated capacitor 41a defines a decoupling capacitor. The same reference numerals are given to the elements in FIG. 6 corresponding to those shown in FIG. 4, and repeated explanations thereof are omitted.

With reference to FIG. 6, the ground side wiring conductors such as the grounding via-holes 75 and 76 to be connected to the ground electrode 69, the terminal 77, the second external terminal electrodes 51a and 51b, and the second feedthrough conductor 47 are substantially the same as those shown in FIG. 4.

The via-hole conductor 73 at the hot-side for the power source and the hot-side conductive land 74 are omitted, on the other hand, as the conductors to be connected to the electrode 68 at the hot-side for the power source. Instead, the first external terminal electrode 49a at the major surface 50 side of the laminated capacitor 41a is connected to the hot-side conductive land on the mother board 67.

According to this preferred embodiment, both of the feedthrough conductors 46 and 47 provided in the laminated capacitor 41a define the wiring conductors at the hot side for the power source for supplying electricity to the MPU chip 64, and define the ground side wiring conductors.

Consequently, the lengths of both of the hot-side lines and ground side lines are greatly decreased to consequently greatly reduce inductance components and impedance components, in addition to simplifying the wiring in the wiring board 62a.

The memory corresponding to the memory 4 shown in FIG. 8 is also omitted in FIG. 6.

Figure 7:
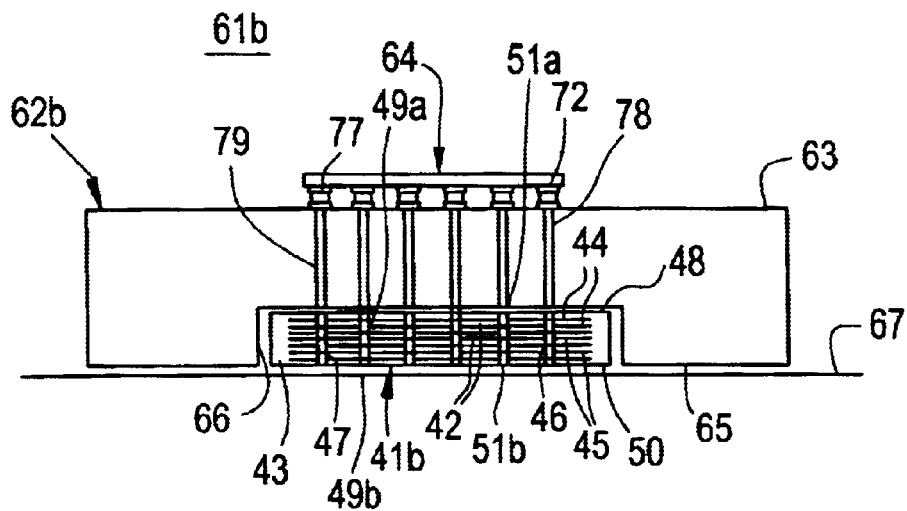
FIG. 7 shows a cross-section illustrating an example of the structure of the MPU 61b in which the laminated capacitor 41b according to a different preferred embodiment of the present invention is used for the decoupling capacitor.

FIG. 7 shows a MPU 61b according to a further preferred embodiment of the present invention. FIG. 4 is a drawing corresponding to FIG. 6. The same reference numerals are given to the elements in FIG. 7 corresponding to those shown in FIG. 4 or 6, and repeated explanations thereof are omitted.

A plurality of terminals 72 provided at the MPU chip 64 are preferably arranged with substantially the same pitch as those of the arrangement of the first and second external terminal electrodes 49a and 51a of the laminated capacitor 41b. The first external terminal electrode 49a is electrically connected to the terminal 72 of the MPU chip 64 through the via-hole 78 at the hot side for the power source, and the second external terminal electrode 51a is electrically connected to the terminal 77 of the MPU chip 64 through the grounding via-hole 79.

According to the preferred embodiment described above, the hot side electrode 68 for the power source and the ground electrode 69 shown in FIG. 4 or FIG. 6, and electrical connections using the via-hole conductors through these electrodes are not needed in the wiring board 62b. Consequently, the lengths of the hot-side lines and ground side lines are greatly reduced to allow the inductance components and impedance components caused by these line lengths to be greatly reduced, in addition to simplifying the wiring within the wiring board 62b.

According to the preferred embodiment shown in FIG. 7, the directions of the electric current flow on the cross section shown in FIG. 7 can be reversed with each other not only between the first feedthrough conductor 46 and the second feedthrough conductor 47 in the laminated capacitor 41b, but also between the via-hole conductor 78 at the hot side for the electric source and the grounding via-hole conductor 79. Consequently, magnetic fields are effectively offset to enable the ESL value to be greatly reduced.

Illustration of a memory corresponding to the memory shown in FIG. 8 is also omitted in FIG. 7.

The second feedthrough conductors 47 and the first feedthrough conductors 46 preferably have larger cross-sectional areas in order to secure a sufficient current-carrying capacity, wherein the second feedthrough conductors 47 are electrically connected to the second external terminal electrodes 51a and 51b located on both the first major surface 48 and the second major surface 50 in the laminated capacitor 41, 41a or 41b, or the first feedthrough conductors 46 are electrically connected to the first external terminal electrodes 49a and 49b when the first external terminal electrodes 49a and 49b are located on both the first major surface 48 and the second major surface 50 as shown in the laminated capacitor 41a or 41b.

For determining the preferable range of the cross-sectional area, the ESL values and current-carrying capacity were determined with respect to the laminated capacitors 41 shows in FIGS. 1 to 3, while variously changing the diameters and cross-sectional areas of the first and second feedthrough conductors 46 and 47.

The laminated capacitors 41 including the inner electrode 44 and 45 having approximate dimensions of 2.5 mm×2.5 mm, and the feedthrough conductors 46 and 47 with an arrangement pitch of about 0.5 mm were prepared as the samples for the experiment, wherein, a total of 16 feedthrough conductors 46 and 47 were arranged in a 4×4 matrix array.

Using the samples described above, the diameter and cross-section of the first and second feedthrough conductors 46 and 47 were changed as shown in TABLE 1 below, and the ESL values and current-carrying capacity were measured for respective samples.

TABLE 1

| DIAMETER ($\mu$m) | CROSS SECTION (mm$^2$) | ESL (pH) | CURRENT CARRYING CAPACITY (A) |
|---|---|---|---|
| 30 | 7.1 × 10$^{-4}$ | 57.4 | 7.3 |
| 50 | 2.0 × 10$^{-3}$ | 37.2 | 12.4 |
| 100 | 7.9 × 10$^{-3}$ | 22.6 | 24.4 |
| 150 | 1.8 × 10$^{-2}$ | 16.8 | 36.7 |

The ESL values shown in TABLE 1 were determined by a resonance method. In the resonance method, the ESL value can be calculated by the equation of $ESL=1/[(2\pi f_0)^2 \times C]$ after determining the frequency characteristics of impedance of the laminated capacitor as the sample, where $f_0$ denotes the frequency at the minimum point (the series resonance point between the capacitance component C and ESL of a capacitor).

The current-carrying capacity is represented by an electric current required for allowing the temperature of the laminated capacitor 41 to increase by 25° C., when an alternating current of 1 kHz flows through the laminated capacitor 41 as the sample used in the experiment.

TABLE 1 shows that the ESL value decreases as the cross-sectional areas of the feedthrough conductors 46 and 47 become larger, even when the arrangement pitch of the feedthrough conductors 46 and 47 remains constant. While consumed electricity tends to increase with recent developments of high speed MPUs, it can be understood that a sufficient amount of current-carrying capacity is ensured by increasing the cross-sectional areas of the feedthrough conductors 46 and 47.

The results shown in TABLE 1 show that the feedthrough conductors 46 and 47, particularly the second feedthrough conductors 47 perforating so as to reach the first and second major surfaces 48 and 50, preferably have a cross sectional area of about 2×10$^{-3}$ mm$^2$ or more, more preferably have a cross sectional area of about 7×10$^{-3}$ mm$^2$ or more, and further preferably have a cross sectional area of about 1.5×10$^{-2}$ mm$^2$ or more.

According to the laminated capacitor of preferred embodiments of the present invention as described above, the respective first and second internal electrodes opposed to each other are connected by the plural first and second feedthrough conductors, plural first external terminal electrodes corresponding to respective first feedthrough conductors are provided on the surface of the capacitor body while the respective electrodes are electrically connected to the plural first feedthrough conductors, and plural second external terminal electrodes corresponding to respective second feedthrough conductors are provided while respective electrodes are electrically connected to plural second feedthrough conductors, thereby allowing the laminated capacitor to have a very low ESL value. In addition, since the first external terminal electrodes are provided at least on the first major surface, and the second external terminal electrodes are provided on both the first major surface and the second major surface, the laminated capacitor mounted on the wiring board achieves the following advantages.

Although respective first and second external terminal electrodes are electrically connected to the wiring conductors at the wiring board side when the laminated capacitor is packaged by directing its first major surface toward the wiring board side, the second external terminal electrodes on the second major surface may be directed toward the outside of the package. Accordingly, when the wiring board mounting the laminated capacitor is packaged on the mother board while the second major surface of the capacitor body is directed, for example, toward the mother board side, the second external terminal electrodes on the second major surface can be directly connected to the grounding side conductive lands on the motherboard. Consequently, the length of the lines at the grounding side related to the laminated capacitor and wiring board are greatly decreased to prevent the inductance components and impedance components from being increased. As a result, the laminated capacitor is extremely effective with high frequency operations in addition to preventing the effect of lowering the ESL value of the laminated capacitor from being compromised. Wiring within the wiring board is also simplified because no wiring conductors for grounding the laminated capacitor are needed within the wiring board.

The hot-side lines can be also shortened when the first external terminal electrodes are located on both the first major surface and second major surface in the laminated capacitor according to preferred embodiments of the present invention, enabling the foregoing advantages to be even more improved.

The laminated capacitor according to preferred embodiments of the present invention as described above can advantageously define a bypass capacitor or a decoupling capacitor operated in a high frequency circuit. While the decoupling capacitor to be used in combination with the MPU chip provided in the MPU is required to have a function as a quick power supply, the laminated capacitor according to preferred embodiments of the present invention is very effective in a high speed operation when used for such decoupling capacitors, because the laminated capacitor intrinsically has a very low ESL that allows it to be mounted on the wiring board without generating a significant inductance component.

The same advantage as described above can be expected in the wiring connection structure of the decoupling capacitor to be connected to the power supply circuit for the MPU chip including the microprocessing unit, when the decoupling capacitor has a capacitor body having the first and second major surfaces opposed to each other, when feedthrough conductors perforating from the first to the second major surfaces are provided within the capacitor body, and when the power supply lines and/or signal lines to be connected to the MPU chip are grounded to the mother board via the feedthrough conductors.

When the laminated capacitor according to preferred embodiments of the present invention is used for the decoupling capacitor to be connected to the power supply circuit for the MPU chip provided in the MPU, the laminated capacitor is packaged by directing its first major surface toward the wiring board side mounting the MPU chip while directing its second major surface toward the outside of the package. However, the laminated capacitor can be compactly packaged on the mother board with high efficiency and security, provided that the MPU chip is mounted on the first substrate surface of the wiring board, a cavity is provided on the wiring board by locating its opening along the second substrate surface in opposed relation to the first substrate face, the laminated capacitor is accommodated in the cavity while allowing the second major surface of the laminated capacitor to be directed toward the opening of the cavity, and the second major surface is located on the same level as the second substrate face of the wiring board.

The ESL value of the laminated capacitor can be further reduced in the laminated capacitor according to preferred embodiments of the present invention, when the feedthrough conductors to be connected to the external terminal electrodes located on both the first major surface and second major surface preferably have cross sectional areas of about $2 \times 10^{-3}$ mm$^2$ or more, more preferably have cross sectional areas of about $7 \times 10^{-3}$ mm$^2$ or more, and further preferably have cross sectional areas of about $1.5 \times 10^{-2}$ mm$^2$ or more. While greater electricity is needed in the recently developed MPUs, the laminated capacitor according to preferred embodiments of the present invention more than satisfy the requirement of increasing the electric current level by lowering the operating voltage, because the current-carrying capacity of the feedthrough conductors is increased by expanding the cross-sectional area of the feedthrough conductors as hitherto described.

When solder bumps are provided on the first and second external terminal electrodes in the laminated capacitor according to preferred embodiments of the present invention, a highly integrated packaging is enabled while suppressing parasitic inductance from being generated.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A capacitor comprising:
    a capacitor body having first and second major surfaces and including a laminated stack of a plurality of dielectric layers, a plurality of first internal electrodes opposed to each other with at least one of the dielectric layers being disposed therebetween and being electrically connected with each other, and a plurality of second internal electrodes opposed to each other with at least one of the dielectric layers being disposed therebetween and being electrically connected with each other;
    a plurality of first external terminal electrodes each being electrically connected to a respective one of the plurality of first internal electrodes; and
    a plurality of second external terminal electrodes each being electrically connected to a respective one of the plurality of second internal electrodes; wherein
        the plurality of first external terminal electrodes are located at least on the first major surface of the capacitor body and extend substantially parallel to the plurality of first internal electrodes, and the plurality of second external terminal electrodes are located on both the first major surface and the second major surface of the capacitor body, and each of the plurality of second external terminal electrodes located on the first major surface of the capacitor body is located directly above a corresponding one of the second external terminal electrodes located on the second major surface of the capacitor body.

2. The capacitor according to claim 1, further comprising a plurality of first feedthrough conductors arranged to electrically connect the plurality of first internal electrodes to the plurality of first external terminal electrodes, and a plurality of second feedthrough conductors arranged to electrically connect the plurality of second internal electrodes to the plurality of second external terminal electrodes.

3. The capacitor according to claim 1, wherein the plurality of first external terminal electrodes are located on only the first major surface of the capacitor body.

4. The capacitor according to claim 1, wherein the plurality of first external terminal electrodes are located on each of the first and second major surfaces of the capacitor body.

5. The capacitor according to Claim 1, wherein solder bumps are provided on each of the plurality of first and second external terminal electrodes.

6. The capacitor according to claim 1, wherein the capacitor defines a decoupling capacitor.

7. The capacitor according to claim 1, wherein each of the plurality of first and second external terminal electrodes has a substantially rounded configuration and is arranged to achieve bump bonding connection.

8. The capacitor according to claim 1, wherein the plurality of first and second internal electrodes have a substantially rectangular plate configuration.

9. The capacitor according to claim 1, wherein the capacitor is arranged to define a decoupling capacitor for a multiprocessing unit.

10. A high frequency circuit comprising at least one capacitor according to claim 1.

11. A circuit board comprising at least one capacitor according to claim 1.

12. The capacitor according to claim 2, wherein the plurality of first feedthrough conductors extend substantially perpendicular to the plurality of first internal electrodes, and the plurality of second feedthrough conductors extend substantially perpendicular to the plurality of second internal electrodes.

13. The capacitor according to claim 4, wherein each of the plurality of first external terminal electrodes located on the first major surface of the capacitor body are located directly above a corresponding one of the first external terminal electrodes located on the second major surface of the capacitor body.

14. The capacitor according to claim 2, wherein at least one of the plurality of first feedthrough conductors has a cross-sectional area that is in the range of at least about $2\times10^{-3}$ mm$^2$ to at least $1.5\times10^{-2}$ mm$^2$.

15. The capacitor according to claim 2, wherein at least one of the plurality of second feedthrough conductors has a cross-sectional area that is in the range of at least about $2\times10^{-3}$ mm$^2$ to at least $1.5\times10^{-2}$ mm$^2$.

16. The capacitor according to claim 2, wherein each of the plurality of first feedthrough conductors extends from the first major surface of the capacitor body to a location that is spaced from the second major surface of the capacitor body.

17. The capacitor according to claim 2, wherein the capacitor body includes a first section extending in a thickness direction thereof and a second section extending in the thickness direction thereof; the plurality of first feedthrough conductors are located in only the first section of the capacitor body and the plurality of second feedthrough conductors are located in each of the first and second sections of the capacitor body.

18. The high frequency circuit according to claim 10, wherein the at least one capacitor is arranged to define one of a bypass capacitor and a decoupling capacitor.

19. The capacitor according claim 17, wherein the first and second sections are divided by an imaginary horizontal line extending substantially parallel to the first and second major surfaces of the capacitor body.

20. The capacitor according to claim 17, wherein the first section comprises an upper portion of the capacitor body and the second section comprises a lower portion of the capacitor body.

21. A laminated capacitor comprising:
a capacitor body having first and second major surfaces and including a laminated stack of a plurality of dielectric layers, a plurality of first internal electrodes opposed to each other with at least one of the dielectric layers being disposed therebetween and being electrically connected with each other, and a plurality of second internal electrodes opposed to each other with at least one of the dielectric layers being disposed therebetween and being electrically connected with each other;
a plurality of first external terminal electrodes each being electrically connected to a respective one of the plurality of first internal electrodes; and
a plurality of second external terminal electrodes each being electrically connected to a respective one of the plurality of second internal electrodes; wherein
the plurality of first external terminal electrodes are located at least on the first major surface of the capacitor body and extend substantially parallel to the plurality of first internal electrodes, and the plurality of second external terminal electrodes are located on both the first major surface and the second major surface of the capacitor body, and the first and second external terminal electrodes located on the first major surface of the capacitor body are arranged in a matrix configuration wherein each of the plurality of first external terminal electrodes is adjacent to one of the plurality of second external terminal electrodes on the first major surface of the capacitor body.

22. The capacitor according to claim 21, wherein the plurality of first external terminal electrodes are located on each of the first and second major surfaces of the capacitor body and are arranged in a matrix configuration with the plurality of second external terminal electrodes located on the first and second major surfaces of the capacitor body, and the matrix configuration of the first and second external terminal electrodes on the first major surface of the capacitor body matches the matrix configuration of the first and second external terminal electrodes on the second major surface of the capacitor body.

23. The capacitor according to claim 21, wherein each of the plurality of first external terminal electrodes is adjacent to at least two of the plurality of second external terminal electrodes on the first major surface of the capacitor body.

24. The capacitor according to claim 21, wherein each of the plurality of first external terminal electrodes is adjacent to at least four of the plurality of second external terminal electrodes on the first major surface of the capacitor body.

25. The capacitor according to claim 21, further comprising a plurality of first feedthrough conductors arranged to electrically connect the plurality of first internal electrodes to the plurality of first external terminal electrodes, and a plurality of second feedthrough conductors arranged to electrically connect the plurality of second internal electrodes to the plurality of second external terminal electrodes.

26. The capacitor according to claim 21, wherein the plurality of first external terminal electrodes are located on only the first major surface of the capacitor body.

27. The capacitor according to claim 21, wherein the plurality of first external terminal electrodes are located on each of the first and second major surfaces of the capacitor body.

28. The capacitor according to claim 21, wherein solder bumps are provided on each of the plurality of first and second external terminal electrodes.

29. The capacitor according to claim 21, wherein the capacitor defines a decoupling capacitor.

30. The capacitor according to claim 21, wherein each of the plurality of first internal electrodes extends from the first major surface of the capacitor body to a location that is spaced from the second major surface of the capacitor body.

31. The capacitor according to claim 21, wherein the capacitor body includes a first section extending in a thickness direction thereof and a second section extending in the thickness direction thereof, the plurality of first internal electrodes are located in only the first section of the capacitor body and the plurality of second internal electrodes are located in each of the first and second sections of the capacitor body.

32. The capacitor according to claim 21, wherein each of the plurality of first and second external terminal electrodes has a substantially rounded configuration and is arranged to achieve bump bonding connection.

33. The capacitor according to claim 21, wherein the plurality of first and second internal electrodes have a substantially rectangular plate configuration.

34. The capacitor according to claim 21, wherein the capacitor is arranged to define a decoupling capacitor for a multiprocessing unit.

35. A high frequency circuit comprising at least one capacitor according to claim 21.

36. A circuit board comprising at least one capacitor according to claim 21.

37. The capacitor according to claim 22, wherein each of the plurality of; first external terminal electrodes is adjacent to at least two of the plurality of second external terminal electrodes on each of the first and second major surfaces of the capacitor body.

38. The capacitor according to claim 22, wherein each of the plurality of first external terminal electrodes is adjacent to at least four of the plurality of second external terminal electrodes on each of the first and second major surfaces of the capacitor body.

39. The capacitor according to claim 25, wherein the plurality of first feedthrough conductors extend substantially perpendicular to the plurality of first internal electrodes, and the plurality of second feedthrough conductors extend substantially perpendicular to the plurality of second internal electrodes.

40. The capacitor according to claim 27, wherein each of the plurality of first external terminal electrodes located on the first major surface of the capacitor body are located directly above a corresponding one of the first external terminal electrodes located on the second major surface of the capacitor body.

41. The capacitor according to claim 25, wherein at least one of the plurality of first feedthrough conductors has a cross-sectional area that is in the range of at least about $2 \times 10^{-3}$ mm$^2$ to at least $1.5 \times 10^{-2}$ mm$^2$.

42. The capacitor according to claim 25, wherein at least one of the plurality of second feedthrough conductors has a cross-sectional area that is in the range of at least about $2 \times 10^{-3}$ mm$^2$ to at least $1.5 \times 10^{-2}$ mm$^2$.

43. The capacitor according to claim 31, wherein the first and second sections are divided by an imaginary horizontal line extending substantially parallel to the first and second major surfaces of the capacitor body.

44. The capacitor according to claim 31, wherein the first section comprises an upper portion of the capacitor body and the second section comprises a lower portion of the capacitor body.

45. The high frequency circuit according to claim 35, wherein the at least one capacitor is arranged to define one of a bypass capacitor and a decoupling capacitor.

46. A laminated capacitor comprising:
a capacitor body having first and second major surfaces and including a laminated stack of a plurality of dielectric layers, a plurality of first internal electrodes opposed to each other with at least one of the dielectric layers being disposed therebetween and being electrically connected with each other, and a plurality of second internal electrodes opposed to each other with at least one of the dielectric layers being disposed therebetween and being electrically connected with each other, each of the plurality of first internal electrodes being adjacent to one of the plurality of second internal electrodes along a thickness direction of the capacitor body extending from the first major surface to the second major surface of the capacitor body;
a plurality of first feedthrough conductors extending substantially perpendicular to the plurality of first internal electrodes and perforating through at least one of the plurality of dielectric layers provided within the capacitor body, the plurality of first feedthrough conductors being electrically insulated from the plurality of second internal electrodes and electrically connected to the plurality of first internal electrodes; and
a plurality of second feedthrough conductors extending substantially perpendicular to the plurality of second internal electrodes and perforating through the capacitor body and provided within the capacitor body, the plurality of second feedthrough conductors being electrically insulated from the plurality of first internal electrodes and electrically connected to the plurality of second internal electrodes, each of the plurality of first feedthrough conductors being located adjacent to one of the plurality of second feedthrough conductors along a width direction of the capacitor body that is substantially perpendicular to the thickness direction of the capacitor body; wherein
the capacitor body includes a first section extending in the thickness direction thereof and a second section extending in the thickness direction thereof, the plurality of first and second internal electrodes and the plurality of first feedthrough conductors are located only in the first section of the capacitor body, and only portions of the plurality of second feedthrough conductors are located in the second section of the capacitor body.

47. The capacitor according to claim 46, further comprising a plurality of first external terminal electrodes each being electrically connected to a respective one of the plurality of first internal electrodes, and a plurality of second external terminal electrodes each being electrically connected to a respective one of the plurality of second internal electrodes.

48. The capacitor according to claim 46, wherein at least one of the plurality of first feedthrough conductors has a cross-sectional area that is in the range of at least about $2 \times 10^{-3}$ mm$^2$ to at least $1.5 \times 10^{-2}$ mm$^2$.

49. The capacitor according to claim 46, wherein at least one of the plurality of second feedthrough conductors has a cross-sectional area that is in the range of at least about $2 \times 10^{-3}$ mm$^2$ to at least $1.5 \times 10^{-2}$ mm$^2$.

50. The capacitor according to claim 46, wherein the capacitor defines a decoupling capacitor.

51. The capacitor according to claim 46, wherein each of the plurality of first feedthrough conductors extends from the first major surface of the capacitor body to a location that is spaced from the second major surface of the capacitor body.

52. The capacitor according to claim 46, wherein the first and second sections are divided by an imaginary horizontal line extending substantially parallel to the first and second major surfaces of the capacitor body.

53. The capacitor according to claim 46, wherein the first section comprises an upper portion of the capacitor body and the second section comprises a lower portion of the capacitor body.

54. The capacitor according to claim 46, wherein the plurality of first and second internal electrodes have a substantially rectangular plate configuration.

55. The capacitor according to claim 46, wherein the capacitor is arranged to define a decoupling capacitor for a multiprocessing unit.

56. A high frequency circuit comprising at least one capacitor according to claim 46.

57. A circuit board comprising at least one capacitor according to claim 46.

58. The capacitor according to claim 47, wherein the plurality of second external terminal electrodes are located on each of the first and second major surfaces of the capacitor body, and each of the plurality of second external terminal electrodes located on the first major surface of the capacitor body is located directly above a corresponding one of the second external terminal electrodes located on the second major surface of the capacitor body.

59. The capacitor according to claim 47, wherein the plurality of first external terminal electrodes are located at least on the first major surface of the capacitor body and extend substantially parallel to the plurality of first internal electrodes, and the second external terminal electrodes are located on both the first major surface and the second major surface of the capacitor body, and the first and second external terminal electrodes located on the first major surface of the capacitor body are arranged in a matrix configuration wherein each of the plurality of first external terminal electrodes is adjacent to one of the plurality of second external terminal electrodes on the first major surface of the capacitor body.

60. The capacitor according to claim 47, wherein the plurality of first external terminal electrodes are located on only the first major surface of the capacitor body.

61. The capacitor according to claim 47 wherein solder bumps are provided on each of the plurality of first and second external terminal electrodes.

62. The capacitor according to claim 47, wherein each of the plurality of first and second external terminal electrodes has a substantially rounded configuration and is arranged to achieve bump bonding connection.

63. The frequency circuit according to clam 56, wherein the at least one capacitor is arranged to define one of a bypass capacitor and a decoupling capacitor.

64. The capacitor according to claim 47, wherein each of the plurality of first external terminal electrodes is adjacent to at least two of the plurality of second external terminal electrodes on the first major surface of the capacitor body.

65. The capacitor according to claim 47, wherein each of the plurality of first external terminal electrodes is adjacent to at least four of the plurality of second external terminal electrodes on the first major surface of the capacitor body.

66. A wiring connection structure of a decoupling capacitor to be connected to a power supply circuit for a MPU chip provided in a microprocessing unit, the decoupling capacitor comprising:
 a capacitor body having first and second major surfaces and including a laminated stack of a plurality of dielectric layers, a plurality of first internal electrodes opposed to each other with at least one of the dielectric layers being disposed therebetween and being electrically connected with each other, and a plurality of second internal electrodes opposed to each other with at least one of the dielectric layers being disposed therebetween and being electrically connected with each other;
 a plurality of first external terminal electrodes each being electrically connected to a respective one of the plurality of first internal electrodes;
 a plurality of second external terminal electrodes each being electrically connected to a respective one of the plurality of second internal electrodes;
 a plurality of first feedthrough conductors arranged to electrically connect the plurality of first internal electrodes to the plurality of first external terminal electrodes;
 a plurality of second feedthrough conductors arranged to electrically connect the plurality of second internal electrodes to the plurality of second external terminal electrodes, wherein the plurality of first external terminal electrodes are located at least on the first major surface of the capacitor body and extend substantially parallel to the plurality of first internal electrodes, and the plurality of second external terminal electrodes are located on both the first major surface and the second major surface of the capacitor body, and each of the plurality of second external terminal electrodes located on the first major surface of the capacitor body is located directly above a corresponding one of the second external terminal electrodes located on the second major surface of the capacitor body; and
 at least one of power supply lines and signal lines connected to the MPU chip are grounded to a mother board via the first and second feedthrough conductors.

67. A wiring connection structure of a decoupling capacitor according to claim 66, wherein a hot side of the power supply circuit is connected to the first external terminal electrodes.

68. A wiring board package apparatus comprising:
 a wiring board;
 a MPU chip of a microprocessing unit mounted on the wiring board;
 wiring conductors at a hot-side thereof for a power source arranged to supply electricity to the MPU chip and ground side wiring conductors; and
 a laminated capacitor having a capacitor body having first and second major surfaces and including a laminated stack of a plurality of dielectric layers, a plurality of first internal electrodes opposed to each other with at least one of the dielectric layers being disposed therebetween and being electrically connected with each other, and a plurality of second internal electrodes opposed to each other with at least one of the dielectric layers being disposed therebetween and being electrically connected with each other, a plurality of first external terminal electrodes each being electrically connected to a respective one of the plurality of first internal electrodes, and a plurality of second external terminal electrodes each being electrically connected to a respective one of the plurality of second internal electrodes, wherein the plurality of first external terminal electrodes are located at least on the first major surface of the capacitor body and extend substantially parallel to the plurality of first internal electrodes, and the plurality of second external terminal electrodes are located on both the first major surface and the second major surface of the capacitor body, and each of the plurality of second external terminal electrodes located on the first major surface of the capacitor body is located directly above a corresponding one of the second external terminal electrodes located on the second major surface of the capacitor body, the laminated capacitor being arranged on the wiring board such that the first major surface is directed toward the wiring board side and the second major surface is directed toward the outside of the package, the first external terminal electrodes at the first major surface side being electrically connected to the wiring conductors at the hot side for the power source, and the second external terminal electrodes at the first major surface side being electrically connected to the ground side wiring conductors.

69. A wiring board package apparatus according to claim 68, wherein the MPU chip is mounted on the first substrate surface of the wiring board, a cavity having an opening along the second substrate surface opposed to the first substrate surface, and the second major surface is directed toward the opening side of the cavity, the second major surface being on the same level as the second substrate surface.

70. A wiring board according to claim 68, wherein the MPU chip comprises a plurality of terminals arranged to have substantially the same pitch as the pitch of the arrangement of the first and second external terminal electrodes of the laminated capacitor.

71. A wiring connection structure of a decoupling capacitor to be connected to a power supply circuit for a MPU chip provided in a microprocessing unit, the decoupling capacitor comprising:
 a capacitor body having first and second major surfaces and including a laminated stack of a plurality of dielectric layers, a plurality of first internal electrodes opposed to each other with at least one of the dielectric layers being disposed therebetween and being electrically connected with each other, and a plurality of second internal electrodes opposed to each other with at least one of the dielectric layers being disposed therebetween and being electrically connected with each other;

a plurality of first external terminal electrodes each being electrically connected to a respective one of the plurality of first internal electrodes;

a plurality of second external terminal electrodes each being electrically connected to a respective one of the plurality of second internal electrodes;

a plurality of first feedthrough conductors arranged to electrically connect the plurality of first internal electrodes to the plurality of first external terminal electrodes;

a plurality of second feedthrough conductors arranged to electrically connect the plurality of second internal electrodes to the plurality of second external terminal electrodes, wherein the plurality of first external terminal electrodes are located at least on the first major surface of the capacitor body and extend substantially parallel to the plurality of first internal electrodes, and the second external terminal electrodes are located on both the first major surface and the second major surface of the capacitor body, and the first and second external terminal electrodes located on the first major surface of the capacitor body are arranged in a matrix configuration wherein each of the plurality of first external terminal electrodes is adjacent to one of the plurality of second external terminal electrodes on the first major surface of the capacitor body; and at least one of power supply lines and signal lines connected to the MPU chip are grounded to a mother board via the plurality of first and second feedthrough conductors.

72. A wiring connection structure of a decoupling capacitor according to claim 71, wherein a hot side of the power supply circuit is connected to the first external terminal electrodes.

73. A wiring board package apparatus comprising:
a wiring board;
a MPU chip of a microprocessing unit mounted on the wiring board;
wiring conductors at a hot-side thereof for a power source arranged to supply electricity to the MPU chip and ground side wiring conductors; and
a laminated capacitor having a capacitor body having first and second major surfaces and including a laminated stack of a plurality of dielectric layers, a plurality of first internal electrodes opposed to each other with at least one of the dielectric layers being disposed therebetween and being electrically connected with each other, and a plurality of second internal electrodes opposed to each other with at least one of the dielectric layers being disposed therebetween and being electrically connected with each other, a plurality of first external terminal electrodes each being electrically connected to a respective one of the plurality of first internal electrodes, and a plurality of second external terminal electrodes each being electrically connected to a respective one of the plurality of second internal electrodes, wherein the plurality of first external terminal electrodes are located at least on the first major surface of the capacitor body and extend substantially parallel to the plurality of first internal electrodes, and the plurality of second external terminal electrodes are located on both the first major surface and the second major surface of the capacitor body, and the first and second external terminal electrodes located on the first major surface of the capacitor body are arranged in a matrix configuration wherein each of the plurality of first external terminal electrodes is adjacent to one of the plurality of second external terminal electrodes on the first major surface of the capacitor body, the laminated capacitor being arranged on the wiring board such that the first major surface is directed toward the wiring board side and the second major surface is directed toward the outside of the package, the first external terminal electrodes at the first major surface side being electrically connected to the wiring conductors at the hot side for the power source, and the second external terminal electrodes at the first major surface side being electrically connected to the ground side wiring conductors.

74. A wiring board package apparatus according to claim 73, wherein the MPU chip is mounted on the first substrate surface of the wiring board, a cavity having an opening along the second substrate surface opposed to the first substrate surface, and the second major surface is directed toward the opening side of the cavity, the second major surface being on the same level as the second substrate surface.

75. A wiring board according to claim 73, wherein the MPU chip comprises a plurality of terminals arranged to have substantially the same pitch as the pitch of the arrangement of the first and second external terminal electrodes of the laminated capacitor.

76. A wiring connection structure of a decoupling capacitor to be connected to a power supply circuit for a MPU chip provided in a microprocessing unit, the decoupling capacitor comprising:

a capacitor body having first and second major surfaces and including a laminated stack of a plurality of dielectric layers, a plurality of first internal electrodes opposed to each other with at least one of the dielectric layers being disposed therebetween and being electrically connected with each other, and a plurality of second internal electrodes opposed to each other with at least one of the dielectric layers being disposed therebetween and being electrically connected with each other, each of the plurality of first internal electrodes being adjacent to one of the plurality of second internal electrodes along a thickness direction of the capacitor body extending from the first major surface to the second major surface of the capacitor body;

a plurality of first feedthrough conductors extending substantially perpendicular to the plurality of first internal electrodes and perforating through at least one of the plurality of dielectric layers provided within the capacitor body, the plurality of first feedthrough conductors being electrically insulated from the plurality of second internal electrodes and electrically connected to the plurality of first internal electrodes;

a plurality of second feedthrough conductors extending substantially perpendicular to the plurality of second internal electrodes and perforating through the capacitor body and provided within the capacitor body, the plurality of second feedthrough conductors being electrically insulated from the plurality of first internal electrodes and electrically connected to the plurality of second internal electrodes, each of the plurality of first feedthrough conductors being located adjacent to one of the plurality of second feedthrough conductors along a width direction of the capacitor body that is substantially perpendicular to the thickness direction of the capacitor body, wherein the capacitor body includes a first section extending in the thickness direction thereof and a second section extending in the thickness direction thereof, the plurality of first and second internal electrodes and the plurality of first feedthrough conductors are located only in the first section of the capacitor body, and only portions of the plurality of second feedthrough conductors are located in the second section of the capacitor body; and at least one of power supply lines and signal lines connected to the MPU chip are grounded to a mother board via the plurality of first and second feedthrough conductors.

77. A wiring connection structure of a decoupling capacitor according to claim 76, wherein a hot side of the power supply circuit is connected to the first external terminal electrodes.

78. A wiring board package apparatus comprising:

a wiring board;

a MPU chip of a microprocessing unit mounted on the wiring board;

wiring conductors at a hot-side thereof for a power source arranged to supply electricity to the MPU chip and ground side wiring conductors; and a laminated capacitor having a capacitor body having first and second major surfaces and including a laminated stack of a plurality of dielectric layers, a plurality of first internal electrodes opposed to each other with at least one of the dielectric layers being disposed therebetween and being electrically connected with each other, and a plurality of second internal electrodes opposed to each other with at least one of the dielectric layers being disposed therebetween and being electrically connected with each other, each of the plurality of first internal electrodes being adjacent to one of the plurality of second internal electrodes in a thickness direction of the capacitor body extending from the first major surface to the second major surface of the capacitor body, a plurality of first feedthrough conductors extending substantially perpendicular to the plurality of first internal electrodes and perforating through at least one of the dielectric layers provided within the capacitor body, the plurality of first feedthrough conductors being electrically insulated from the plurality of second internal electrodes and electrically connected to the plurality of first internal electrodes, and a plurality of second feedthrough conductors extending substantially perpendicular to the plurality of second internal electrodes and perforating through the capacitor body and provided within the capacitor body, the plurality of second feedthrough conductors being electrically insulated from the first internal electrodes and electrically connected to the plurality of second internal electrodes, each of the plurality of first feedthrough conductors being located adjacent to one of the plurality of second feedthrough conductors in a width direction of the capacitor body that is substantially perpendicular to the thickness direction of the capacitor body, wherein the capacitor body includes a first section extending in the thickness direction thereof and a second section extending in the thickness direction thereof, the plurality of first and second internal electrodes and the plurality of first feedthrough conductors are located only in the first section of the capacitor body, and only portions of the plurality of second feedthrough conductors are located in the second section of the capacitor body, the laminated capacitor being arranged on the wiring board such that the first major surface is directed toward the wiring board side and the second major surface is directed toward the outside of the package, the first external terminal electrodes at the first major surface side being electrically connected to the wiring conductors at the hot side for the power source, and the second external terminal electrodes at the first major surface side being electrically connected to the ground side wiring conductors.

79. A wiring board package apparatus according to claim 78, wherein the MPU chip is mounted on the first substrate surface of the wiring board, a cavity having an opening along the second substrate surface opposed to the first substrate surface, and the second major surface is directed toward the opening side of the cavity, the second major surface being on the same level as the second substrate surface.

80. A wiring board according to claim 78, wherein the MPU chip comprises a plurality of terminals arranged to have substantially the same pitch as the pitch of the arrangement of the first and second external terminal electrodes of the laminated capacitor.

* * * * *